United States Patent [19]

Kitagawa et al.

[11] 4,435,788
[45] Mar. 6, 1984

[54] NONVOLATILE SEMICONDUCTOR MEMORY DEVICE

[75] Inventors: Norihisa Kitagawa, Tokyo; Hiroji Asahi, Zama, both of Japan

[73] Assignee: Texas Instruments Incorporated, Dallas, Tex.

[21] Appl. No.: 230,162

[22] Filed: Jan. 30, 1981

[51] Int. Cl.³ .................. G11C 11/40; G11C 7/00
[52] U.S. Cl. ........................... 365/185; 365/205
[58] Field of Search ..................... 365/205, 185

[56] References Cited

U.S. PATENT DOCUMENTS

| 4,096,401 | 6/1978 | Hollingsworth | 365/205 |
| 4,133,049 | 1/1979 | Shirato | 365/205 |
| 4,236,231 | 11/1980 | Taylor | 365/205 |

Primary Examiner—Stuart N. Hecker
Attorney, Agent, or Firm—John G. Graham

[57] ABSTRACT

A nonvolatile semiconductor memory device comprising a plurality of memory cells arranged in a matrix pattern and means for sensing data stored in said memory cells, characterized in that each of said memory cells comprises a pair of symmetrical submemory cells, and the pair of said submemory cells can store logic states opposite to each other.

3 Claims, 2 Drawing Figures

NONVOLATILE SEMICONDUCTOR MEMORY DEVICE

This invention relates to a nonvolatile memory to be incorporated in a semiconductor integrated circuit, and more particularly to a nonvolatile semiconductor memory device having a data holding time extended owing to a novel memory cell structure.

Among typical nonvolatile memory devices, there is one which is based upon the metal-nitride-oxide-silicon (MNOS) technique. Researches and studies on this MNOS technique have been made for a long time before this MNOS technique can be practically applied to the manufacture of products, although its application is still limited. There are, however, the following difficult problems which have not yet been solved up to date:

(1) The gate oxide film must be very thin, e.g., thinner than 50 Å, resulting in difficulty of process control.

(2) The yield rate, reliability and data holding characteristic of products are not yet sufficient, and the costs of the products are still high.

(3) Power sources of positive polarity and negative polarity are required for the operation of the memory, and the interchangeability or compatibility with its peripheral circuits, for example, a decoder circuit and a driver circuit is not yet sufficient.

(4) A special external voltage is required to provide a drive signal having a very slow transient time.

In an effort to overcome these defects, a memory including a floating gate into which both of electrons and holes are injected, that is, a technique commonly called a dual-injector floating-gate MOS has been developed and an example of such a technique is described in "I.E.E.E. Transaction on Electron Devices", Vol. ED-24, No. 5, May, 1977, pp. 594–599. The proposed memory has the following features:

(1) The memory is formed according to the p-channel MOS manufacuring technique which has been already established and, therefore, the memory is inexpensive and compatible with another circuit.

(2) Due to the fact that the power source voltage is of single polarity, this DIFMOS can be integrated together with any other p-channel logic circuits.

(3) The special timing and the special external voltage required for the MNOS memory are unnecessary.

However, the data holding capability, which is the most important factor required for a nonvolatile memory, is not still enough to satisfy the recent demand for consumer products. The principal reasons, therefore, are considered to be as follows:

(1) The voltage stored in the memory is compared in a sensing amplifier with a predetermined voltage value Vth which is a function of the threshold voltage of the MOS transistor. Due to, however, the fact that Vth is generally set at a slightly higher voltage level in order to ensure minimization of variations of variables in the manufacturing process, independent optimization of the value of Vth is difficult.

(2) Since the threshold voltage Vth is constant in a specific MOS structure, the data storage time is strictly limited when the initial level of the voltage stored in the memory cell is relatively low.

In view of these situations, the present invention contemplates the provision of a nonvolatile semiconductor memory device capable of exhibiting an improved data holding characteristic.

It is a first object of the present invention to provide a nonvolatile semicondutor memory device in which its unit memory cell is composed of a pair of symmetrical submemory cells, and a sensing amplifier comparing data stored in the two submemory cells is disposed in the memory device so as to extend the data holding time. Data is written in the submemory cells respectively to be stored in the form of logic states opposite to each other.

Another object of the present invention is to provide a non-volatile semiconductor memory device in which the outputs from the pair of the submemory cells are compared in a differential type sensing amplifier of high sensitivity so that the data can be read out with high sensitivity without regard to the threshold voltage level of the insulated-gate FET's included in the memory cell.

Figure 1:
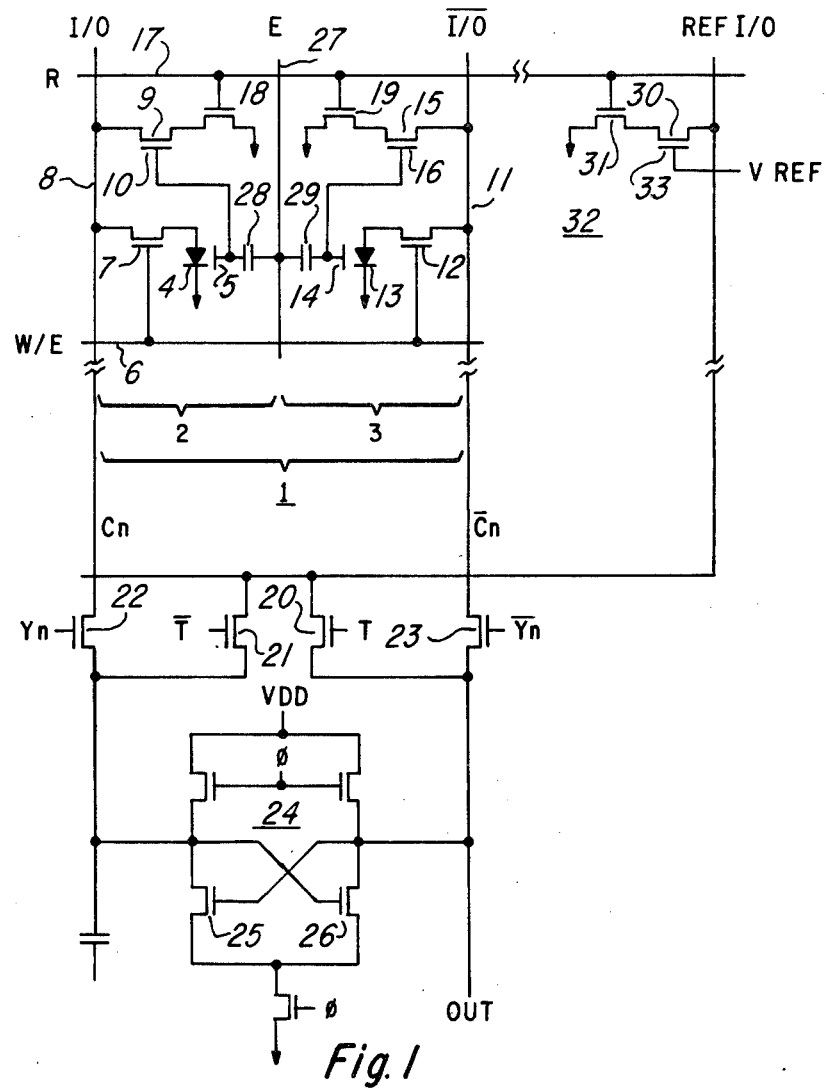
FIG. 1 shows a unit memory cell in the nonvolatile memory device according to the present invention.

The unit memory cell 1 as shown if FIG. 1 comprises two subcells 2 and 3 symmetrical with each other, and the first subcell 2 includes an electron-hole injector diode 4 and a floating gate 5 isolated from the diode 4 by a thin insulator layer. The floating gate 5 has no electrical connection with an external terminal and is electrically floating. In order to write a data in this floating gate 5, a negative high potential is applied to a write/erase X line 6 to turn on an X-address transistor 7, and a negative high potential is applied from an input-/output Y line 8 to the pn junction of the injector diode 4. When a sufficiently high reverse bias of, for example, 18 volts is applied across this junction to cause avalanche breakdown in the junction, the injector diode 4 produces a plasma of hot electrons, and some of the electrons migrate through the thin silicon oxide film covering the junction to be injected into and arrested by the floating gate 5. This electron injection continues until the electric field built up by the injected carriers obstructs any further injection of the electrons. The floating gate 5 of the injector diode 4 is connected by an internal wiring to a floating gate 10 of a sensing transistor 9. The aforementioned electric field built up by the injected electrons is programmed to turn the sensing transistor 9 into its off-state.

As described above, a negative high voltage (a logic "1") is applied to the first input/output-purpose Y line 8 (I/O in FIG. 1). On the other hand, logic "0" opposite to the logic "1", that is, a ground potential is applied to a second input/output-purpose Y line 11 ($\overline{I/O}$ in FIG. 1) associated with the second subcell 3. Therefore, even when an X-address transistor 12 in the second subcell 3 may be turned on due to the application of the negative high voltage to the write-purpose X line 6, no reverse bias is applied across the junction of an injector diode 13 connected thereto, and no electrons are injected into its floating gate 14. As a result, no change occurs in the electric field built up in a floating gate 16 of a sensing transistor 15 in the second subcell 3, and the sensing transistor 15 is programmed to be turned into its on-state.

Such a programmed writing operation is carried out by selecting an address line connected to a memory cell in which a data is to be written, after data stored in all the memory cells have been erased.

Due to the fact that the two floating gates 10 and 16 have no electrical connections with external terminals, the on-state or off-state thereof is maintained unless the erasing operation is done after removal of the voltages applied to the write-purpose X line and input-purpose Y lines. The floating gates 5, 10, 14, 16 and the internal wiring interconnecting them may be a layer of a metal such as aluminum or may be a layer of polycrystalline silicon rendered electrically conductive.

The data stored in the memory cell 1 is read out by selecting the memory cell 1, applying a negative high potential to a read-purpose Y line 17 and turning on both an address transistor 18 in the first subcell 2 and an address transistor 19 in the second subcell 3. When the data has already been written in the memory cell 1 shown in FIG. 1, the sensing transistor 9 in the first subcell 2 is in its off-state, while the sensing transistor 15 in the second subcell 3 is in its on-state. Therefore, a negative high potential or a logic "1" appears on the output-purpose Y line 8, while a ground potential or a logic "0" appears on the other output-purpose Y line 11.

In the normal read mode, test-mode select signals $\overline{T}$ and T are applied to turn off test-mode select transistors 20 and 21, while column select signals Yn and $\overline{Yn}$ are applied to turn on column select transistors 22 and 23. In response to the application of these select signals, the output Cn (a logic "1" in the above case) appearing on the output-purpose Y line 8 and the output $\overline{Cn}$ (a logic "0" in the above case) appearing on the output-purpose Y line 11 are applied to a differential type sensing amplifier 24. This sensing amplifier 24 is a high-sensitivity differential type amplifier including a pair of transistors 25 and 26, the symbols Vdd and $\phi$ in FIG. 1 designate a power source and a clock input respectively. In the process of reading of the output from the memory cell 1 in the manner above described, the data stored in the memory cell 1 can be accurately read in spite of its time-dependent attenuation as far as the difference between the storage voltages provided by the charges stored in the floating gates 10 and 16 in the first and second subcells 2 and 3, respectively, is larger than the minimum sensitivity $\Delta Vs$ (for example, 50 mV–300 mV) of the sensing amplifier 24. In other words, the data holding time of the memory cell can be extended compared with that of prior art ones.

The data stored in the memory cell 1 is erased in a manner as described below. A negative high voltage (a logic "1") is applied to the erase-purpose X line 6 and Y line 27 and also to the input/output-purpose Y lines 8 and 11. The address transistors 7 and 12 are turned on, and due to the application of the high voltage to the Y lines 8 and 11, avalanche breakdown occurs in the injector diodes 4 and 13, thereby producing a plasma. However, due to the fact that this erase mode differs from the aforementioned write mode in that the negative potential of the erase-purpose Y line 27 is applied indirectly to the floating gates 5 and 14 through bootstrap capacitors 28 and 29, holes in the produced plasma migrate through the thin insulator film and are injected into the floating gates 5 and 14 to be recombined with the electrons stored therein. As a result, the sensing transistors 9 and 15 are both turned on to erase the data stored in the memory cell 1.

A test for examining the data holding characteristic of the memory cell 1 is carried out in a manner as described below.

On the outside of the plural memory cells arranged in matrix pattern, a plurality of reference cells 32, each of which comprises a reference sensing transistor 30 produced by the same manufacturing process as that for the sensing transistors 9 and 15 in the memory cell 1 and having a gate insulator layer formed under the same condition and a reference address transistor 31 connected to the sensing transistor 30, are formed in an arrayed relation by the number equal to the number of rows of the memory cells of matrix arrangement. Theoretically, provision of only one of such reference cells 32 suffices to deal with the plural memory cells. However, when the improvement in the accuracy of the test and the balance of the integrated circuit are taken into consideration, it is preferable that the number of the reference cells 32 is equal to the number of rows of the memory cells as shown in the embodiment, and the reference address transistors 31 operate in synchronism with the address transistors 18 and 19 in the memory cells under control of the read-purpose X lines 17 the number of which is equal to the number of rows of the memory cells.

Another important feature is that a reference voltage Vref is applied to the gate 33 of the sensing transistor 30 in each of the reference cells 32. When the integrated circuit includes p-channel insulated-gate FET's as in the present embodiment, this reference voltage Vref is a predetermined negative voltage lower in absolute value than the write-purpose initial voltage applied to the floating gate 10 in the memory cell 1. It is to be noted further that data is written in all of the subcells prior to the test for examining the data holding characteristic of the memory cells.

In the test for examining the data holding characteristic of the memory cell 1, the test-mode select signals of logic levels T=1 and $\overline{T}$=0 are applied to turn on the transistor 20 and turn off the transistor 21. On the other hand, the column select signals of logic levels Yn=1 and $\overline{Yn}$=0 are applied to turn on the transistor 22 and turn off the transistor 23.

Under such a condition, the stored data output Cn from the subcell 2 and the output from the reference cell 32 are compared in the differential type sensing amplifier 24 placed in the test mode.

For the subcell 3, the test mode select signals of logic levels T=0 and $\overline{T}$=1 are applied, while the column select signals of logic levels Yn=0 and $\overline{Yn}$=1 are applied, and the output $\overline{Cn}$ from the subcell 3 and the output from the reference cell 32 are compared in the differential type sensing amplifier 24 placed in the test mode.

Figure 2:
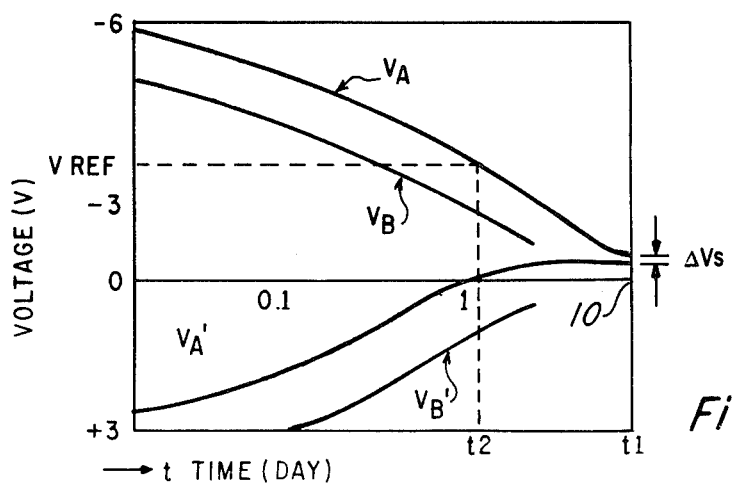
FIG. 2 is a graph showing the time-dependent attenuation of a data stored in the memory cell shown in FIG. 1.

FIG. 2 is a graph showing the time-dependent attenuation of the data stored in the memory cell 1. The horizontal axis represents the relative time in a logarithmic scale, and the vertical axis represents the voltage. In FIG. 2, the curve $V_A$ represents the voltage stored in the floating gate 10 in the subcell 2 of the memory cell 1, and the curve $V_A'$ similarly represents the voltage stored in the floating gate 16 in the subcell 3. In the normal temperature range of from the room temperature to about 70° C., the storage voltage $\overline{V_A}$ attenuates or decreases with time from the negative initial level of about $-6$ volts by reason of, for example, presence of defects in the insulator and finally drops to a fraction of the initial value in about ten years. On the other hand, the storage voltage $V_A'$ of the floating gate 16 in the subcell 3 decreases gradually from its positive initial level of about 2.5 volts, and it finally may have a polarity opposite to the initial polarity in some cases.

In the memory cell according to the present invention, voltages of polarities opposite to each other are stored in the pair of subcells 2 and 3, respectively, so that the difference therebetween represents a data, and the high-sensitivity differential type sensing amplifier senses the value of the difference. Therefore, the data storage time can be remarkably improved. That is, the data can be accurately held and read out until the difference between $V_A$ and $V_A'$ decreases to the level of the minimum sensitivity $\Delta V_S$ of the sensing amplifier.

In the prior art single cell system in which the data holding time is limited by the threshold voltage of the sensing transistor, it has been difficult to independently optimize this threshold voltage, and it has been a common practice to set the threshold voltage rather at a slightly higher level taking into account the marginal allowances of the factors of the manufacturing process. According to the structure of the memory cell and differential type sensing amplifier of the present invention, data holding time about five times as long as that of the prior art memory cell can be obtained.

The aforementioned test for examining the data holding characteristic of the memory cell 1 will be explained with reference to FIG. 2. In the test on such a memory cell, it is not impractical to continue the test for a length of time as long as ten years at the normal temperature. Therefore, the test duration is generally shortened while accelerating deterioration of the memory cell under the condition of heating at 125° C. to 150° C. According to the embodiment of the present invention, a reference cell is separately formed in the vicinity of the memory cell under the same condition, and a predetermined reference voltage Vref is applied to this reference cell, so that the output from the memory cell can be compared with the output from the reference cell. The value of this reference voltage Vref is selected to be intermediate between the threshold voltage of the reference sensing transistor and the initial value of the storage voltage of the sensing transistor in the memory cell so as to optimize the voltage taking into account the shortening of the test duration and the accuracy of the test results.

In an example of the test, a data is written in the memory cell under the temperature condition of 130° C., and after 24 hours, Vref = −3 volts is applied to the reference cell. When an output indicative of the fact that the data is stored in the subcell 2 of the memory cell 1 appears from the sensing amplifier 24, the storage voltage $V_A$ of the subcell 2 is proved to be higher than −2 volts. This storage voltage $V_A$ higher than −3 volts is held until the time t2 corresponding to about one day is reached (more than about one year under the normal temperature condition). In this manner, the storage voltage $V_A$ of the subcell 2 at the time t1 corresponding to about ten days (about ten years under the normal temperature condition) can be accurately estimated from the model curve shown in FIG. 2. The subcell 3, too, can be similarly tested by comparing $V_A$ with Vref.

If another subcell which ought to store a data therein is similarly tested and the sensing amplifier 24 provides an output indicative of absence of data storage, the storage voltage $V_B$ of that subcell is proved to have an insufficient storage characteristic at the time t2. $V_B'$ represents the storage voltage of a subcell forming a pair with said another subcell.

What is claimed is:

1. A non-volatile semiconductor memory device comprising a plurality of memory cells arranged in a matrix pattern of rows and columns and row address means including separate row lines for read and write for each row and separate true and complement column lines for each column, sense amplifier means connected to the column lines for sensing data stored in said memory cells, characterized in that each of said memory cells comprises a pair of symmetrical submemory cells, each submemory cell containing a floating gate and injector means, and the pair of said submemory cells can store logic states opposite to each other on said floating gates.

2. A non-volatile semiconductor memory device as claimed in claim 1, characterized in that each of said sense amplifier means is a differential type sensing amplifier which compares outputs on said true and complement column lines from the pair of said submemory cells.

3. A device according to claim 2 wherein the injector means in each submemory cell is coupled to one of the column lines by a write access transistor controlled by the row line for write, and wherein the floating gate in each submemory cell is coupled to one of the column lines by a read access transistor controlled by a row line for read.

* * * * *